United States Patent [19]
Lee et al.

[11] Patent Number: 5,701,589
[45] Date of Patent: Dec. 23, 1997

[54] METHOD FOR ADJUSTING REFERENCE FREQUENCIES IN A COMMUNICATION SYSTEM

[75] Inventors: Steven G. Lee, Elgin; Brian D. Iehl, Hoffman Estates; Omer Manya, Palatine; Michael J. Schellinger, Vernon Hills; Robert F. D'Avello, Lake Zurich, all of Ill.

[73] Assignee: Motorola, Inc., Schaumburg, Ill.

[21] Appl. No.: 246,650

[22] Filed: May 20, 1994

[51] Int. Cl.$^6$ ................................................ H04Q 7/20
[52] U.S. Cl. ..................... 455/56.1; 455/33.1; 455/71; 455/88; 379/61
[58] Field of Search ................. 455/56.1, 54.1, 455/33.1, 34.1, 34.2, 67.1, 71, 75, 88; 379/61, 62

[56] References Cited

U.S. PATENT DOCUMENTS

| | | | |
|---|---|---|---|
| 4,989,230 | 1/1991 | Gillig et al. | 455/56.1 |
| 5,077,790 | 12/1991 | D'Amico et al. | 379/62 |
| 5,081,705 | 1/1992 | Swanke | 455/73 |
| 5,363,376 | 11/1994 | Chuang et al. | 455/56.1 |
| 5,410,588 | 4/1995 | Ito | 455/33.2 |

*Primary Examiner*—Reinhard J. Eisenzopf
*Assistant Examiner*—Philip J. Sobutka
*Attorney, Agent, or Firm*—John J. King

[57] ABSTRACT

A method generally improves the frequency accuracy in a communications system without requiring the use of accurate frequency references in all of the stations or types of stations. An accurate frequency reference is utilized in one of the stations or station types. The reference frequencies of the remaining stations or station types can be adjusted based upon the accurate reference frequency in one of the stations.

19 Claims, 12 Drawing Sheets

FIG. 5 —PRIOR ART—

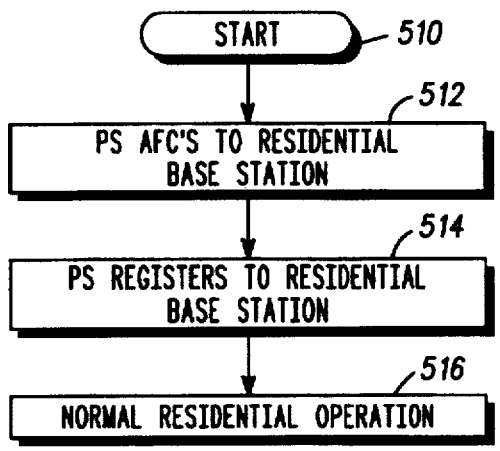
FIG.6
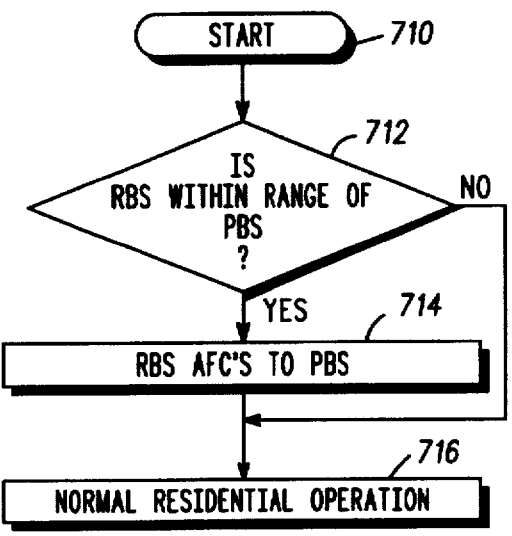
FIG.8
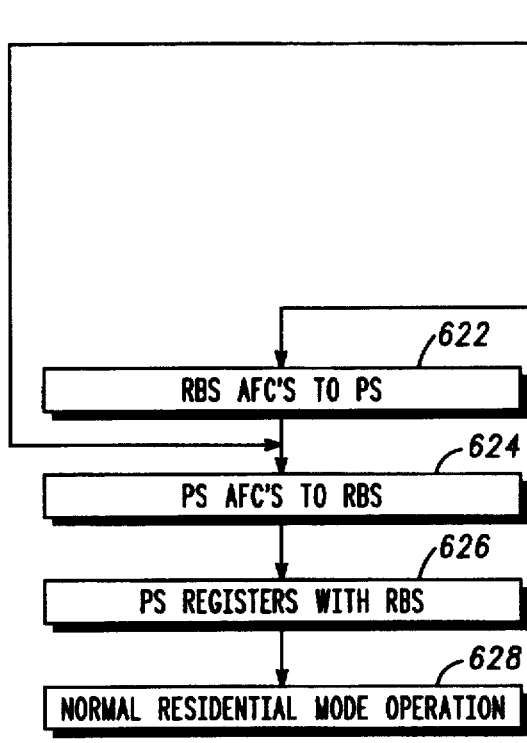
FIG.7
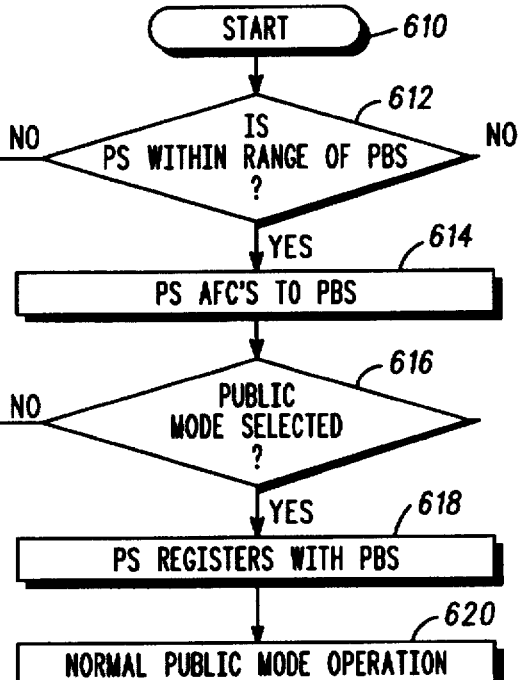

METHOD FOR ADJUSTING REFERENCE FREQUENCIES IN A COMMUNICATION SYSTEM

FIELD OF THE INVENTION

The present invention relates generally to communication devices, and more particularly to a method for adjusting the frequency of a device in a communication system.

BACKGROUND OF THE INVENTION

A cordless telephone system typically includes a portable station (such as portable cordless handset) and a residential base station (such as a cordless base station) connected to a telephone company phone system by telephone landlines. The residential base station has an assigned landline telephone number that allows the user to place and receive calls using the portable station within a limited range of the residential base station, such as in a home. However, due to their limited range, the portable station provides the user with relatively local radiotelephone communication.

Radiotelephone communication outside the range of the residential telephone system may also be provided to the user via a cellular telephone system. A cellular telephone system typically includes cellular subscriber units (mobile or portable) and cellular base stations connected to the landline telephone system via one or more cellular switching networks. Each cellular subscriber unit has an assigned cellular telephone number that allows the user to place and receive calls within a widespread range of the cellular base stations, such as throughout a metropolitan area. However, the cost of using the cellular telephone service is much greater than the cordless telephone service.

A cordless communication system incorporating a portable station is shown. The portable station has the ability to communicate with a conventional cellular radiotelephone system (which has a plurality of cellular base stations), a public base station, or a residential base station (which provides private telephone line interconnection to the telephone network for the user of the portable station). The public base station could for example be a microcellular base station. However, a problem exists when these communications systems rely on very accurate control of transmitted frequencies. In the past, this has been accomplished by utilizing a very accurate frequency reference in the cellular base station, in the public base station, in the residential base station and in the portable station. These very accurate frequency references are too costly for incorporation into a low cost radiotelephone.

In the prior art for a system that only utilized two station types, for example a cellular base station and a portable station, the need for a very accurate frequency reference in the portable station was eliminated. This was accomplished by utilizing a very accurate frequency reference in the cellular base station and using a lower accuracy frequency reference and an Automatic Frequency Control (AFC) circuit in the portable station. The AFC circuit was used to adjust the portable's frequency reference based on the received signal from the cellular base station. In this manner, the accuracy of the portable's frequency reference was improved.

However, this did not improve the situation for a system which included stations that could not directly monitor a station which included a very accurate frequency reference.

Accordingly, there is a need for a method and apparatus that will provide the required level of frequency accuracy to the communications system without requiring the use of very accurate frequency references in all of the types of stations. By utilizing a very accurate frequency reference in one of the station types, for example, in the cellular base station, it is possible to achieve a high level of frequency accuracy in all of the other station types.

There is a further need to eliminate the requirement for a frequency error detection capability in the radiotelephone that is adjusting its frequency reference based on the frequency reference of the radiotelephone with which it is communicating.

BRIEF DESCRIPTION OF THE DRAWINGS

FIG. 6 is a block diagram of a method for a portable station communicating with a residential base station according to the present invention.

FIG. 7 is a block diagram of a first embodiment of a method for adjusting reference frequencies in a communication system according to the present invention.

FIG. 8 is a block diagram of a second embodiment of a method for adjusting reference frequencies in a communication system according to the present invention.

DETAILED DESCRIPTION OF A PREFERRED EMBODIMENT

The method of the present invention generally provides a required level of frequency accuracy to a communications system without requiring the use of very accurate frequency references in all of the stations or types of stations. A very accurate frequency reference is utilized in one of the stations or station types. The remaining stations or station types utilize lower accuracy frequency references. Through the method of the present invention, the frequency accuracy of all of the stations utilizing the lower accuracy frequency references can be improved. This can be accomplished even though the individual stations may not be able to communicate with the station containing the very accurate frequency reference.

Figure 1:
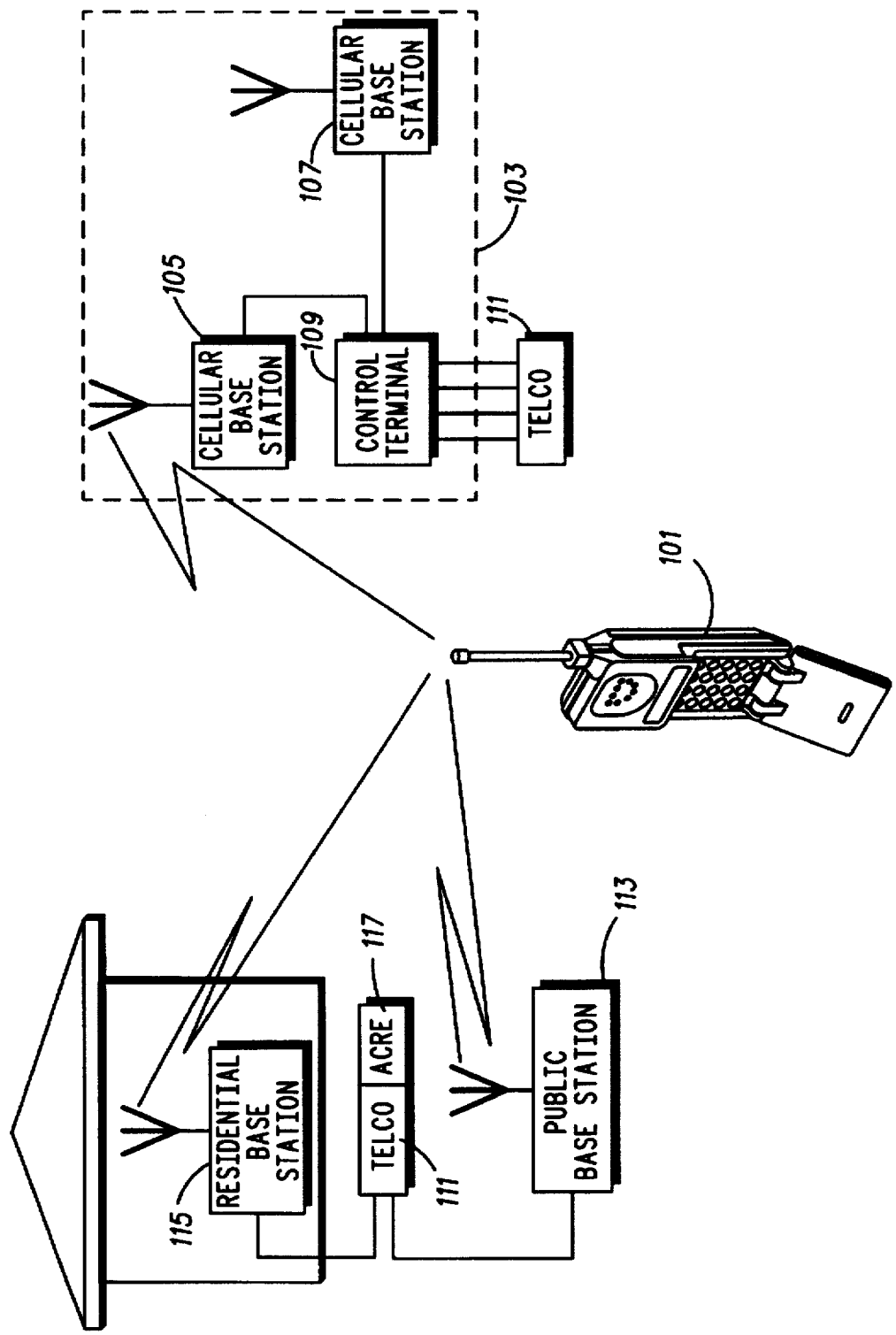
FIG. 1 is a block diagram of an operating configuration for a portable radiotelephone in which several systems, including both a cellular system and a residential system, may be accessed by the same portable radiotelephone.

A generalized block diagram of an application of the present invention is shown in FIG. 1. A portable station 101 may have the ability to communicate with a conventional cellular radiotelephone system 103, which has a plurality of cellular base stations 105, 107 located at geographically separate locations but arranged to provide radiotelephone coverage over a wide geographic area. The cellular base stations are coupled to a control terminal 109 which provides coordination among the plurality of cellular base stations, including handoff of user cellular mobile and portable equipment, and provides call switching and interconnect to the public switched telephone network (identified hereinafter as "TELCO") 111.

The portable station 101 further may have the capacity to communicate with a public base station 113, which is a cellular adjunct cell having lower power and limited capabilities but providing public radiotelephone service to distinct areas such as shopping malls, airports, etc. The public base station 113 is coupled to the TELCO 111 landline telephone system so that calls can be placed to the TELCO.

Finally, the portable station 101 may have the capability to communicate with and place radiotelephone calls via a residential base station 115, which provides private telephone line interconnection to the TELCO 111 for the user of the portable station 101. The cordless communication system uses an authorization and call routing equipment (ACRE) 117 to provide call routing information to a telephone switching system. Thus, the switching system automatically routes phone calls between the cellular, public and residential systems. The ACRE 117 also authorizes the residential base station 115 to utilize channels. The ACRE 117 can be part of the TELCO 111 or can be a stand alone device. As previously noted, the residential base station 115 and the portable station 101 together provide the limited range radio service conventionally known as cordless telephone service. Such service has become pervasive, conventionally using a few radio frequency channels in the VHF (very high frequency) or UHF (ultra high frequency) radio bands.

The user of a radiotelephone should expect that radiotelephone service be available wherever he travels in the United States and that this service is provided at the lowest cost. It is also to be expected that radiotelephone service be provided in a portable unit that is as compact and inexpensive as possible. The portable station 101 is uniquely configured to meet this end. While the portable may be adapted to communicate with all three systems shown, the portable may be adapted to communicate with any combination of systems. For example, the portable station may be adapted to communicate with the residential base and the cellular base. Alternatively, the portable station may be adapted to communicate the residential base and the public base station. Furthermore, the residential base station 115 is uniquely designed to provide telephone interconnect to the user's home telephone line when the user has the portable station 101 within the radio range of the residential base station 115. While a single portable station is shown, systems supporting multiple portable stations are within the scope of the present invention.

Figure 2:
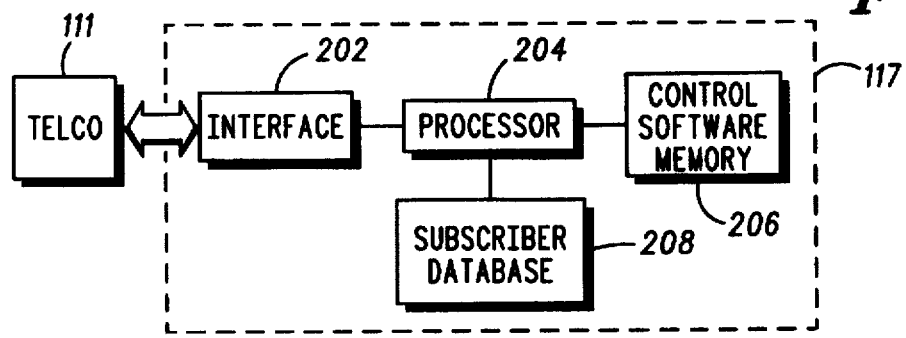
FIG. 2 is a block diagram of an authorization and call routing equipment (ACRE).

A block diagram of the ACRE 117 is shown in FIG. 2. The ACRE 117 is connected to a TELCO 111 by an interface 202. The interface 202 controls and formats messages between the TELCO 111 and a processor 204. The processor 204 in combination with a control software memory 206 is the intelligence of the ACRE 117 and performs authorization, and authentication tasks and provides call routing information. A subscriber database 208 contains the data required by the processor 204 in order to perform the tasks discussed above. The ACRE 117 can be separate from the TELCO 111 as shown in FIG. 2 or can be part of the TELCO 111, usually part of the switching equipment. When the ACRE 117 is part of the TELCO 111 the ACRE 117 may not need the interface 202. Additionally, the functions of the ACRE may be performed by existing equipment at the TELCO. Finally, according to some aspects of the present invention, the ACRE may only provide authentication functions and could be considered authentication equipment. While the following description refers generally to an ACRE, it will be understood the term ACRE could also be considered to describe authorization equipment depending upon the implementation.

Figure 3:
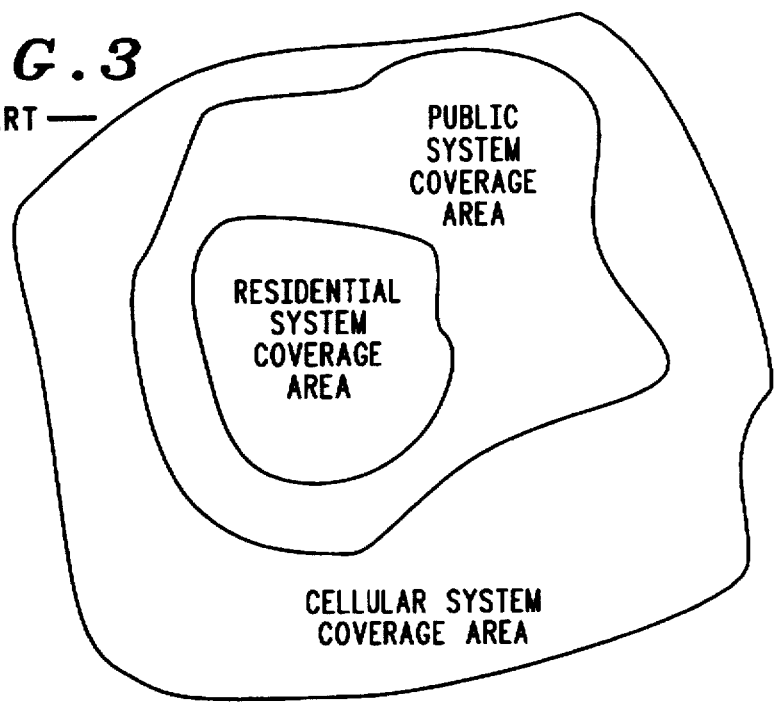
FIG. 3 is a diagrammatical map which shows a typical arrangement of coverage areas for the residential, public and cellular systems.

FIG. 3 shows a typical arrangement of coverage areas for the residential, public and cellular systems. The residential system coverage area is the smallest and resides within the public system. The public system has intermediate coverage and resides within the cellular system. The coverage area of each system may depend upon but is not limited to the number of base stations in each system, antenna height of each base station and the power level used by each system. The user of the portable radiotelephone may relocate between the various coverage areas. The portable radiotelephone may change between systems based on but not limited to portable radiotelephone location, system availability, and user preference.

The coverage areas of the systems are not limited to the particular arrangement as shown in FIG. 3. A coverage area may be independent of another coverage area or may partially overlap one or more other coverage areas.

The residential base station 115, conceptually, is a subminiature cellular system providing a single signaling channel which transmits outbound data messages in a fashion analogous to a conventional cellular outbound signaling channel, and receives service requests from a remote unit, such as a portable station 101. Proper service requests are granted with an assignment of a voice channel (made via the control channel) on the same or a second radio frequency to which the portable station 101 is instructed to tune for its telephone call.

Figure 4:
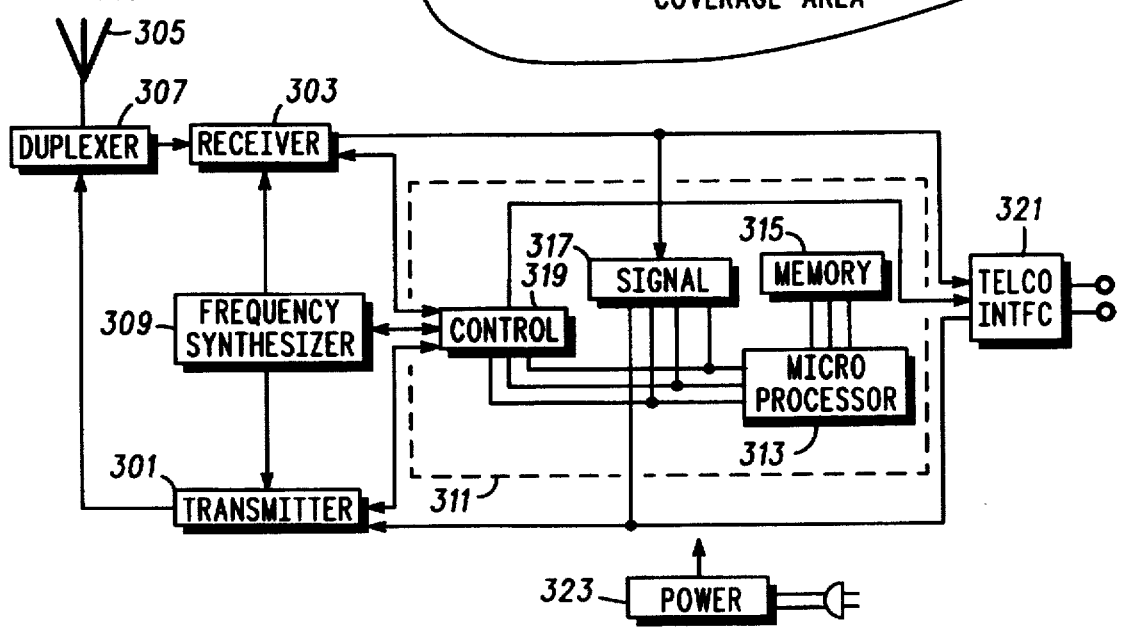
FIG. 4 is a block diagram of a conventional residential base station which may employ the present invention.

The basic implementation of a residential base station is shown in FIG. 4. A conventional transmitter 301 and a conventional receiver 303 suitable for use in the 869 to 894 MHz and 824 to 849 MHz band of frequencies, respectively, being used for conventional cellular services, are coupled to a common antenna 305 via a duplexer 307. Duplexer 307 could also be a switch in a time division duplex (TDD) system. The channel frequency selection is implemented by a frequency synthesizer 309 controlled by a logic unit 311. Within the logic unit 311 is a microprocessor 313, such as a 68HC11 available from Motorola, Inc., or similar microprocessor, which is coupled to conventional memory devices 315 which store the microprocessor operating program, base identification (BID) and customizing personality, and other features. Received and transmitted data is encoded/decoded and coupled between the receiver 303, the transmitter 301, and the microprocessor 313 by signaling interface hardware 317. The microprocessor instructions are conveyed and implemented by control hardware 319. Interface with the user's home landline telephone line is conventionally accomplished via a TELCO interface 321. Power is supplied from the conventional AC mains and backed-up with a battery reserve (all depicted as power 323).

Figure 5:
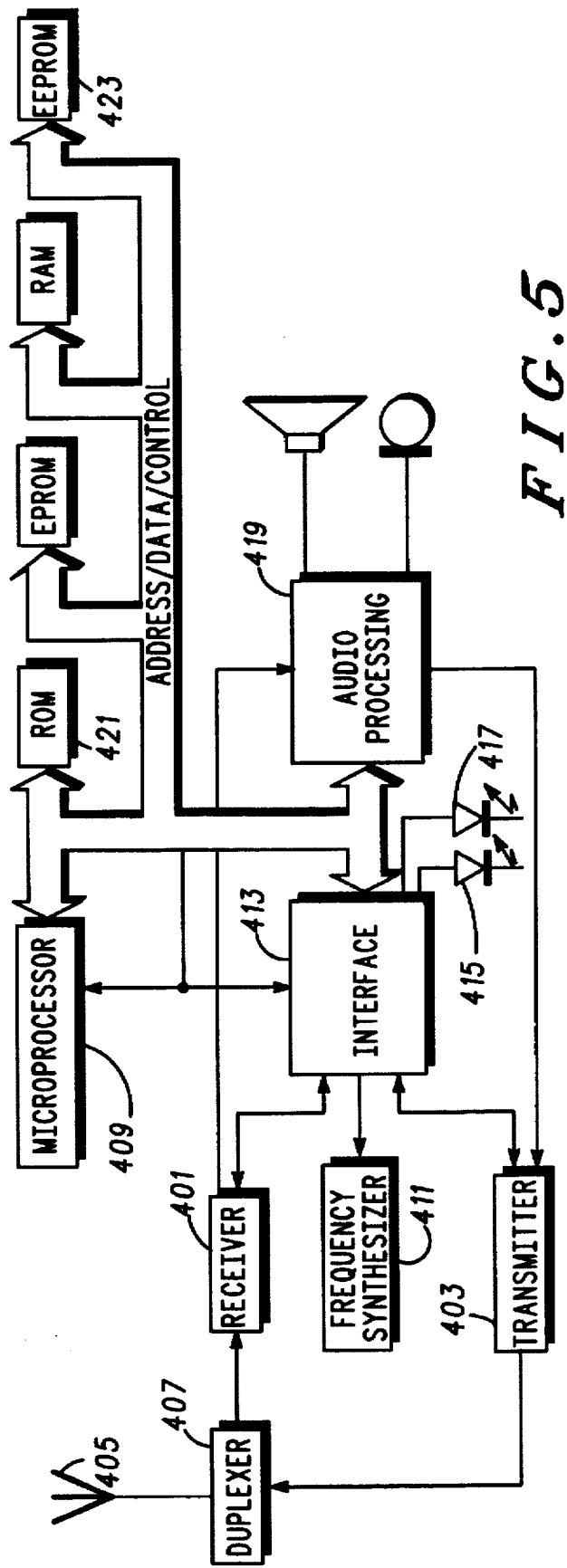
FIG. 5 is a block diagram of a conventional portable radiotelephone which may employ the present invention.

The portable station 101 is a portable radiotelephone transceiver which is shown in block diagram form in FIG. 5. A portable radio receiver 401, capable of receiving the band of frequencies between 869 and 894 MHz, and a portable transmitter 403, capable of transmitting with low power (approximately 6 milliwatts in the preferred embodiment) on frequencies between 824 and 849 MHz, are coupled to the antenna 405 of the portable station 101 by way of a duplexer 407. While a duplexor is shown, element 407 could be a switch in a TDD system. The particular channel of radio frequency to be used by the transmitter 403 and the receiver 401 is determined by the microprocessor 409 and conveyed to the frequency synthesizer 411 via the interface circuit 413. Data signals received by the receiver 401 are decoded and coupled to the microprocessor 409 by the interface circuit 413 and data signals to be transmitted by the transmitter 403 are generated by the microprocessor 409 and formatted by the interface 413 before being transmitted by the transmitter 403. Operational status of the transmitter 403 and the receiver 401 is enabled or disabled by the interface 413. The interface also controls light emitting diodes, 415 and 417, which are used to indicate to the user which system the portable station 101 is currently receiving. Control of user audio, the microphone output and the speaker input, is controlled by audio processing circuitry 419.

In the preferred embodiment, the microprocessor 409 is a 68HC11 microprocessor, available from Motorola, Inc., and performs the necessary processing functions under control of programs stored in conventional ROM 421. Characterizing features of the portable station 101 are stored in EEPROM 423 (which may also be stored in the microprocessor, on-board EEPROM) and include the number assignment (NAM) required for operation in a conventional cellular system and the base identification (BID) required for operation with the user's own residential base.

According to the preferred embodiment of the present invention, the same portable station 101 is compatible with both the residential and cellular telephone system 103. This is accomplished by enabling the portable station 101 to operate in both a residential and cellular telephone system 103 using only cellular telephone frequencies.

The radiotelephone arrangement has desirable advantages for the user. The portable station 101, in combination with the residential base station 115, can automatically route, via the ACRE 117, an incoming call to the telephone system in which the portable station 101 is located without inconveniencing the user. The TELCO 14, in combination with the ACRE 117, can automatically route an incoming call to the portable station 101 without inconveniencing the user.

Turning now to FIG. 6, a block diagram shows a general method for adjusting the reference frequency of a portable station in a communication system having a portable station and a residential base station. In particular, the portable uses automatic frequency control (AFC) to adjust its reference frequency to the frequency of the residential base station at a step 512. The portable station then registers to the residential base station at a step 514. The system then assumes normal residential operation at a step 516.

Turning now to FIG. 7, a first embodiment of a method for updating frequencies in a communication system is shown. The method of FIG. 7 generally includes steps of updating the reference frequency of a portable station based upon the reference frequency of the public base station, adjusting the reference frequency of the residential base station using automatic frequency control based upon the adjusted reference frequency of the portable station, and maintaining the reference frequency of the portable station based upon the reference frequency of the residential base station. In particular, the method of FIG. 7 starts at a step 610, for example when the portable station is powered up. At a step 612, the portable station determines whether it is in range of the public base station. If the portable station is within range, the portable station adjusts its frequency using automatic frequency control to the reference frequency of the public base station at a step 614.

In a step 616, the mode of operation is generally determined. The mode of operation could be manually selected by the user, for example with a switch, or could be automatically selected by the portable station depending upon the availability of the systems which are being selected and the desired order of systems which should be selected. In a system in which the portable station could communicate with a residential base station and a public base station, it is determined whether the public mode is selected at a step 616.

If the public mode is selected, the portable station registers with the public base station at a step 618 and assumes normal public mode operation at a step 620. If the public mode is not selected at 616, the residential base station adjusts its reference frequency using automatic frequency control to the reference frequency of the portable station at a step 622. The portable station then adjusts its reference frequency using automatic frequency control to the reference frequency of the residential base station at a step 624. The portable station then registers with the residential base station at a step 626. The registration process is used to insure that the portable station is authorized to communicate with the residential base station. The registration of a portable station with a base station is well known in the art. Finally, the residential base station assumes normal mode of operation at a step 628. During normal residential mode operation, the portable station will preferably periodically adjusts its reference frequency using automatic frequency control to the reference frequency of the residential station. It should be noted that if the portable station is not within the range of the public base station at a step 612, the portable station adjusts its reference frequency using automatic frequency control to the reference frequency of the residential base station at a step 624.

In summary, according to one novel feature of the method of FIG. 7, the portable station establishes a reference frequency based upon an accurate reference frequency, such as that of the public base station. The residential base station then adjusts its reference frequency based upon the reference frequency of the portable station. Finally, because the residential base station may exist in an environment in which the reference frequency may remain more stable, the portable station will periodically update its reference frequency based upon the reference frequency of the residential base station.

Turning now to FIG. 8, a second embodiment of a method for adjusting a reference frequency in a communication system is shown. The method of FIG. 8 generally updates the frequency of the residential base station based upon the reference frequency of the public base station. In particular, the residential base station determines whether it is within range the public base station at a step 712. If the residential base station is within range of the public base station, the residential base station adjusts its reference frequency using automatic frequency control to the reference frequency of the public base station at a step 714. The communications system assumes normal residential operation at a step 716. During normal operation, the portable station could adjust its reference frequency using automatic frequency control to the reference frequency of the residential base station.

Figure 9:
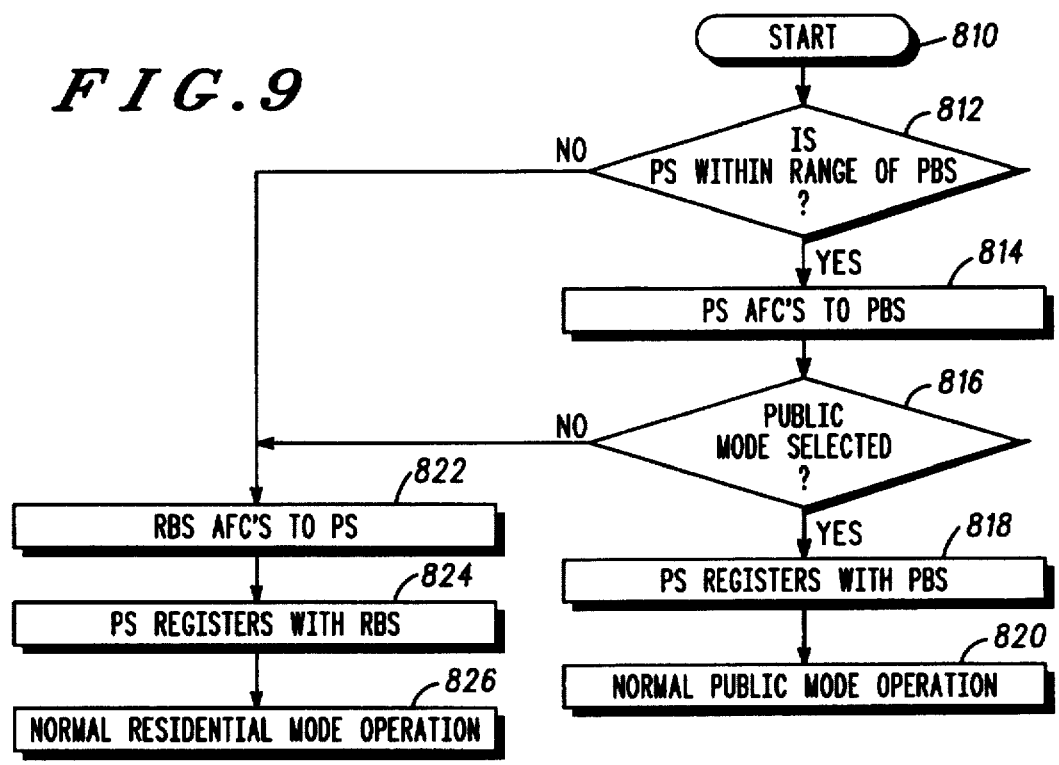
FIG. 9 is a block diagram of a third embodiment of a method for adjusting reference frequencies in a communication system according to the present invention.

Turning now to FIG. 9, a third embodiment of a method for adjusting the frequencies in a communication system is shown. According to the method of FIG. 9, the portable station adjusts its frequency using automatic frequency control to the reference frequency of the public base station, and the residential base station adjusts/maintains its reference frequency to the reference frequency of the portable station. In particular, the portable station determines whether it is within range of the public base station at a step 812. If the portable station is within range, the portable station adjusts its reference frequency using automatic frequency control to the reference frequency of the public base station at a step 814. If the public mode is selected at a step 816, the portable station registers with public base station at a step 818. The communication system assumes normal public mode operation at a step 820, wherein the portable station periodically updates its reference frequency based upon the reference frequency of the public base station. If the public mode is not selected at step 816, the residential base station adjusts its reference frequency using automatic frequency control to the frequency of the portable station at a step 822. The portable then registers with the residential base station at a step 824 and assumes normal residential mode operation at a step 826. During the normal residential operation, the residential base station will preferably adjusts its reference frequency using automatic frequency control to the frequency of the portable station.

Figure 10:
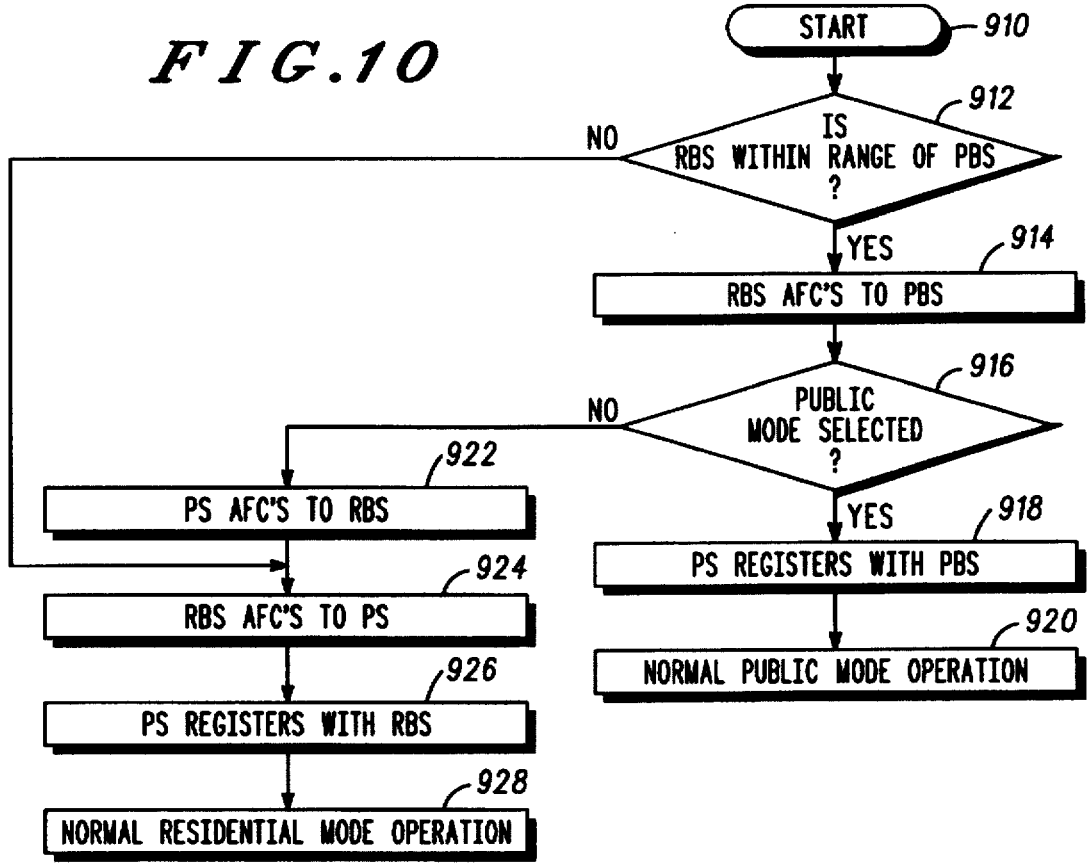
FIG. 10 is a block diagram of a fourth embodiment of a method for adjusting reference frequencies in a communication system according to the present invention.

Turning now to FIG. 10, a fourth embodiment of a method for adjusting reference frequencies in a communication system is disclosed. The method of FIG. 10 generally adjusts the reference frequency of the residential base station using automatic frequency control based upon the reference frequency of the public base station, then updates the reference frequency of the portable station based upon the reference frequency of the residential base station. The reference frequency of the residential base station is then maintained based upon the reference frequency of the portable station. Referring specifically to the blocks of FIG. 10, the residential base station determines whether it is within range of the public base station at a step 912. If it is within range, the residential base station adjusts its reference frequency using automatic frequency control based upon the reference frequency of the portable base station at a step 914.

At a step 916, it is determined whether the public mode is selected. If the public mode is selected, the portable station registers with the public base station at a step 918 and assumes normal public mode operation at a step 920. If the public mode is not selected, the portable station adjusts its frequency using automatic frequency control based upon the reference frequency of the residential base station at a step 922. The residential base station then adjusts its frequency based upon the reference frequency of the portable station at a step 924. The portable station then registers with the residential base station at a step 926 and assumes normal residential mode operation at a step 928. During normal residential mode operation, the residential base station will preferably periodically update its reference frequency based upon the reference frequency of the portable station. It should be noted that if the residential base station is not within range of the public base station at a step 912, the residential base station will adjust its frequency based upon the reference frequency of the portable station 924 and the portable station will register and assume normal residential operation at a step 926 and 928.

Figure 11A:
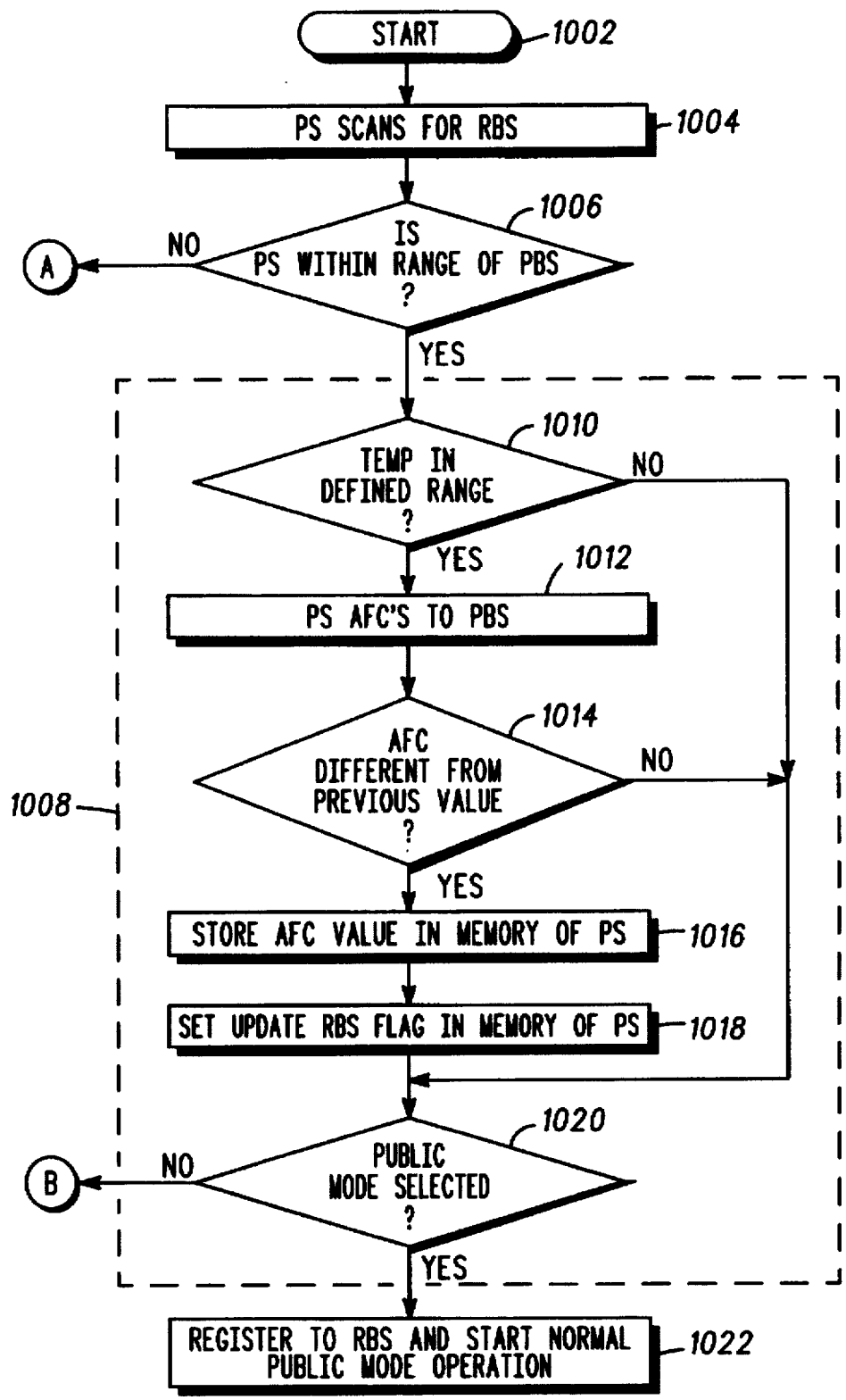
FIG. 11 is a detailed block diagram of a method for adjusting reference frequencies in a communication system according to the first embodiment shown in FIG. 7.

Turning now to FIG. 11, a detailed block diagram shows a specific implementation of the general method shown in FIG. 7. In particular, the portable station scans for the public base station at a step 1004. If the portable station is within range of the public base station at step 1006, the portable station decides whether to adjust its frequency at a step 1008. In particular, the portable station determines whether the temperature is within a defined range at a step 1010. The temperature could be the actual temperature of the portable station, the ambient temperature, or some other predetermined temperature in the system. Alternatively, the decision of whether to adjust the frequency of the portable station could be based upon some other criteria. Temperature is one factor which influences the stability of a reference frequency and is given by way of example. If the temperature is within the defined range, the portable station adjusts its reference frequency to the reference frequency of the public base station at a step 1012. The portable station then determines at a step 1014 whether the adjusted reference frequency value is different from the previous value stored. The portable station then stores AFC value in memory at a step 1016. The portable station also sets an update RBS flag in memory at a step 1018. Preferably, the memory is a non-volatile memory of the portable station. If the temperature is not within the defined range or the adjusted reference frequency is not different from the previous value, the portable station determines whether the public mode has been selected at a step 1020. If the public mode has been selected, the portable station registers to the public base station and starts normal public mode operation in a step 1022.

Figure 11B:
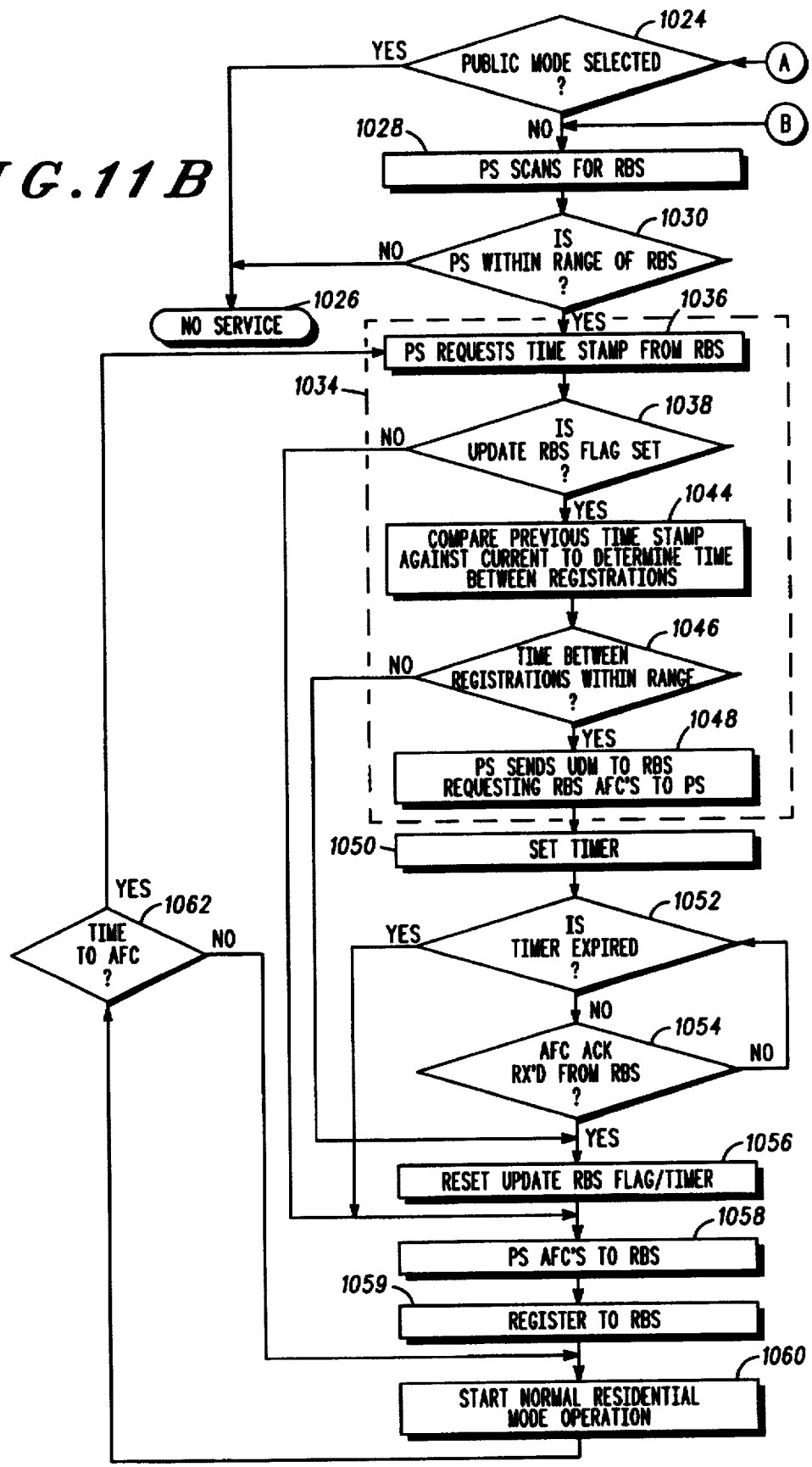

If the portable station is not within range of the public base station at step 1006, the portable station determines whether the public mode has been selected at a step 1024 (FIG. 11B). If the public mode has been selected, no service is provided at step 1026. If the public mode has not been selected, the portable station scans for the residential base station at a step 1028 (regardless of whether the portable station adjusted its reference frequency at step 1012 depending upon the temperature evaluation at step 1008). The portable station determines whether it is within range of the residential base station at a step 1030. If the portable station is not within range, no service is provided. However, if the portable station is within range of the residential base station the portable station performs a remote base station frequency update procedure at a step 1034.

In particular, at a step 1036, the portable station requests a time stamp from the remote base station. The portable station determines whether the update RBS flag is set at a step 1038. If the update RBS flag has been set, the portable station compares the previous time stamp against the current time stamp to determine the time between registrations at a step 1044. If the time between registrations is within predetermined range at a step 1046, the portable station send a user defined message (UDM) to the residential base station requesting the residential base station to adjust its reference frequency to the reference frequency of the portable station at a step 1048. After the portable station sends the UDM, a timer is set at a step 1050. The portable station determines whether the timer has expired at a step 1052.

If the timer has not expired, the portable station determines whether an AFC acknowledge signal is received from the residential base station at a step 1054. If no AFC acknowledgment is received, the portable station determines whether the timer has expired at 1052. If the portable station has received an acknowledgement signal, or the timer has expired, the update RBS flag and timer are reset at a step 1056. At a step 1058 the portable station updates its reference frequency to the reference frequency of the residential base station. The portable station registers with the residential base station at step 1059 and starts normal residential mode operation at a step 1060. Finally, at a step 1062, a test is performed to determine if it is time to perform an AFC operation. If yes, the procedure is performed again beginning with step 1036. If it is not time to perform an AFC operation, the portable station resumes normal residential mode operation at 1060.

Figure 12:
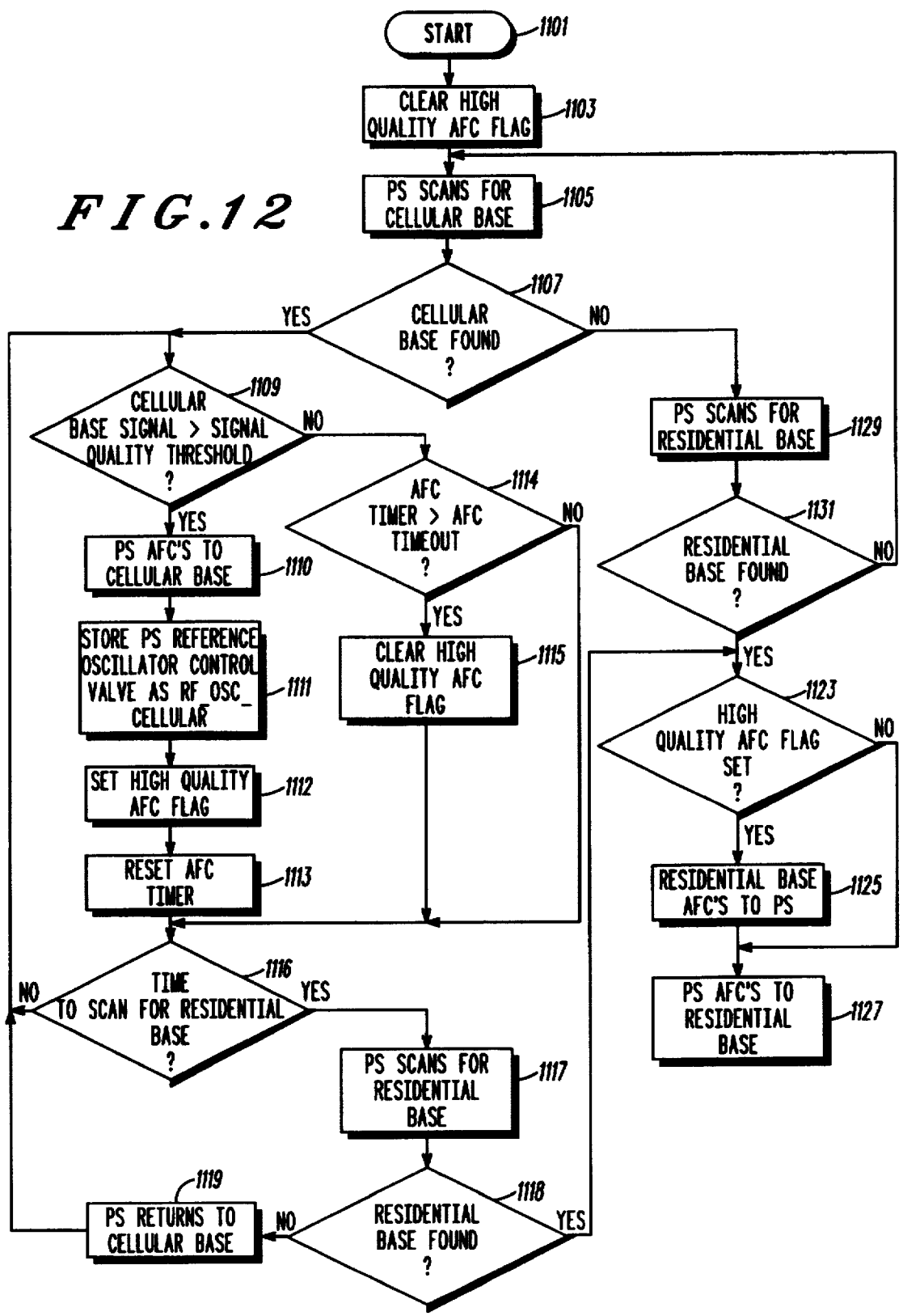
FIG. 12 is a block diagram of a fifth embodiment of a method for adjusting reference frequencies in a communication system according to the present invention.

Turning now to FIG. 12, an alternate embodiment for adjusting the frequencies of devices in a communication system is shown. The method of FIG. 12 generally shows a method of updating the reference frequency of a residential base by first updating the reference frequency of a portable station based upon the reference frequency of the cellular base station, and then using this updated reference to update the reference frequency of the residential base station. This method includes steps to ensure that the portable has a high quality reference frequency and that too much time has not elapsed since the portable unit acquired the updated reference frequency. In particular, a HIGH QUALITY AFC FLAG is cleared at a step 1103. The portable station then scans for a cellular base station at a step 1105. If the cellular base station is found at a step 1107, the portable station determines whether the cellular base station signal is greater than a signal quality threshold at a step 1109. If the signal quality exceeds the threshold, the portable station adjusts its reference frequency to the reference frequency of the cellular base station at a step 1110. At a step 1111 the portable station stores the reference oscillator setting as REF_OSC_CELLULAR. The portable station then sets a HIGH QUALITY AFC FLAG at a step 1112. In a step 1113, the portable station resets an AFC timer. The portable station then determines at a step 1116 whether it is time to scan for a residential base. This could be done, for example, in a system where the portable station switches modes automatically if a different mode of service is available. The portable station then scans for a residential base at step 1117 if it is time to scan. If no residential base is found at a step 1118, the portable station returns to the cellular base at a step 1119. If the residential base is found at step 1118, the portable station determines whether the HIGH QUALITY AFC FLAG is set at step 1123. If the FLAG is set, the reference frequency of the residential base station is adjusted to the reference frequency of the portable station. (FIGS. 13-16 describe specific methods in which the reference frequency of the residential base station can be updated at step 1125.) The portable station then adjusts its reference frequency to the reference frequency of the residential base station at a step 1127. If the HIGH QUALITY AFC FLAG is not set at step 1123, the process continues at step 1127 with the portable station adjusting its reference frequency to the reference frequency of the residential base station.

If it is not time to scan for a residential base at step 1116, the portable station determines whether the cellular base station signal is greater than a signal quality threshold at a step 1109.

If the cellular base station signal is not greater than a signal quality threshold at step 1109, the AFC timer is checked at step 1114. If it does not exceed the AFC timeout, the process continues at step 1116 by determining whether it is time to scan for a residential base. If the AFC timer has exceeded the AFC timeout, the HIGH QUALITY AFC FLAG is cleared at step 1115 before continuing to step 1116.

If the cellular base station is not found at step 1107, the portable station scans for the residential base station at a step 1129. If the residential base station is not found at step 1131, the portable station then scans for the cellular base station at 1105.

Figure 13:
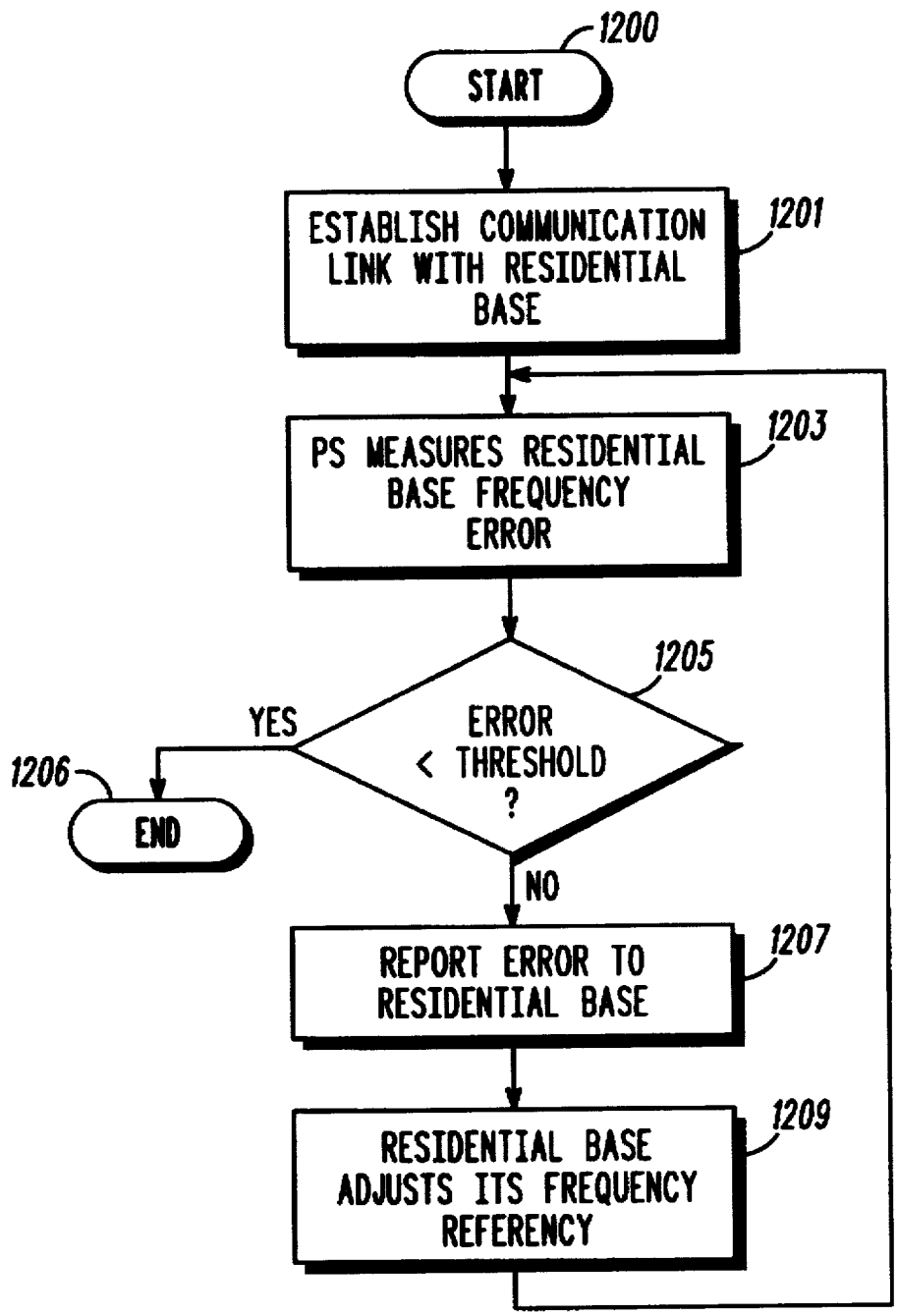
FIG. 13 is an expanded block diagram of block 1129 of FIG. 12 showing a method for adjusting the reference frequency of the residential base.

Turning now to FIG. 13, a first method for adjusting the reference frequency of the residential base station at step 1125 of FIG. 12 is described. In particular, the portable station establishes a communication link with the residential base station at a step 1201. The portable station then measures the residential base station frequency error at step 1203. If the error is less than a threshold at a step 1205, there is no need to adjust the reference frequency of the residential base station. However, if the error is greater than the threshold, the portable station reports the error to the residential base station at a step 1207. The residential base station then adjusts the frequency at a step 1209 and returns to step 1205 to determine whether the error is less than the threshold.

Figure 14:
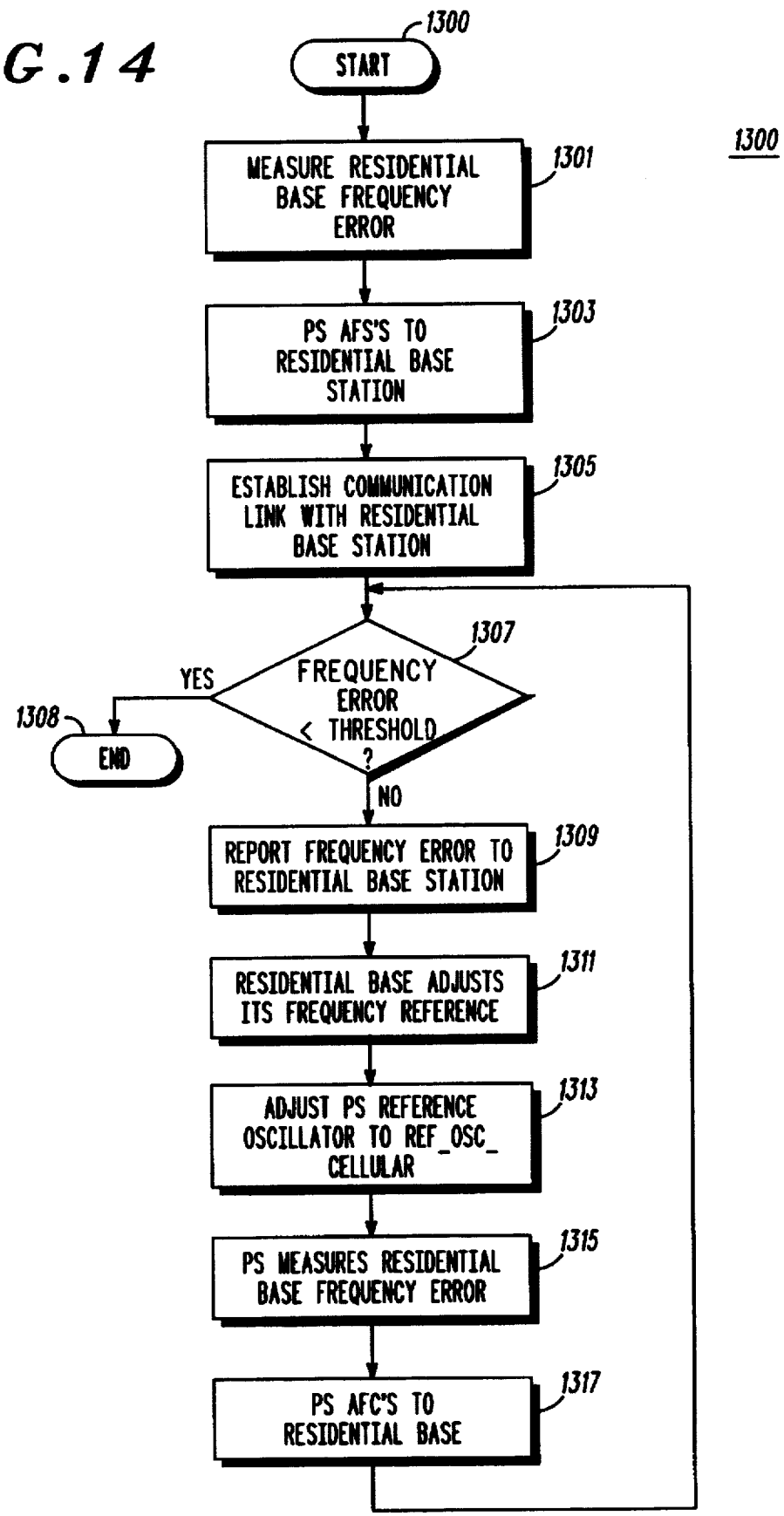
FIG. 14 is an expanded block diagram of block 1129 of FIG. 12 showing an alternate method for adjusting the reference frequency of the residential base.

Turning now to FIG. 14, an alternate embodiment for adjusting the reference frequency of the residential base station is shown. In particular, the portable station measures the residential base station frequency error at a step 1301. The portable station then adjusts its reference frequency by automatic frequency control to the reference frequency of the residential base station at a step 1303. The portable station establishes a communication link with the residential base station at a step 1305. The portable station then determines whether the frequency error is less than a threshold at a step 1307. If the frequency error is less than a threshold, there is no need to update the reference frequency of the residential base station. However, if the error is not less than a threshold, the portable stations reports the frequency error to the residential base station at a step 1309. The residential base station adjusts its reference frequency at a step 1311. In a step 1 313, the portable station saves the reference oscillator value to REF_OSC_CELLULAR. The portable station then measures the residential base frequency error in a step 1315. The portable station then adjusts its reference frequency by automatic frequency control to the frequency of the residential base station at a step 1317. In a system where the size of the frequency adjustment made by the the residential base is known by the portable station, step 1317 could be accomplished by the portable station simply tuning to the updated residential base station frequency. The process then returns to a step 1307 to determine if the frequency error is less than the threshold.

Figure 15:
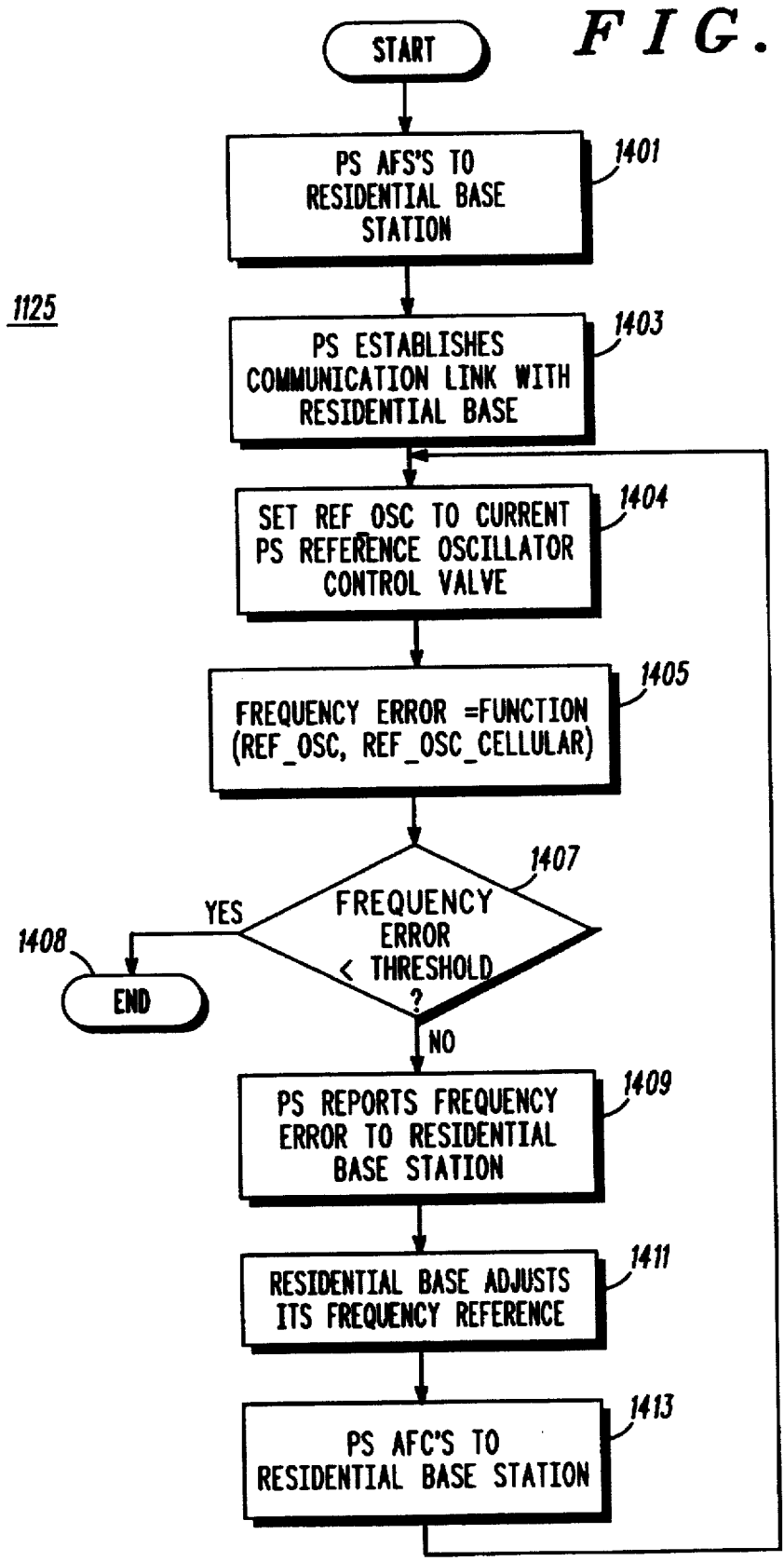
FIG. 15 is an expanded block diagram of block 1129 of FIG. 12 showing an alternate method for adjusting the reference frequency of the residential base.

Turning now to FIG. 15, another alternate embodiment for adjusting the reference frequency of the residential base station is shown. In particular, in a step 1401, the portable station adjusts its frequency to the residential base station. The portable station then establishes a communication link with the residential base station at a step 1403. In step 1404, the portable station updates REF_OSC to the current value of the reference oscillator control value. The frequency error is then determined at a step 1405. The frequency error is a function of the REF_OSC value and the REF_OSC_CELLULAR. The frequency error could simply be the difference between the REF_OSC and REF_OSC_CELLULAR, or some other function of those two values. In a step 1407, the portable station determines whether the frequency error is less than a threshold. If the frequency error is less than the threshold, there is no need to update the residential base station reference frequency; However, if the frequency error is greater than a threshold, the portable station reports the frequency error to the residential base station at a step 1409. The residential base station adjusts its reference frequency at a step 1411. The portable station then adjusts its reference frequency to the reference frequency of the residential base station at a step 1413, and returns to step 1404 to update the value of REF_OSC.

It should be noted that in a system where the residential base is known to be able to adjust in a single step, this process could end after step 1411.

Figure 16:
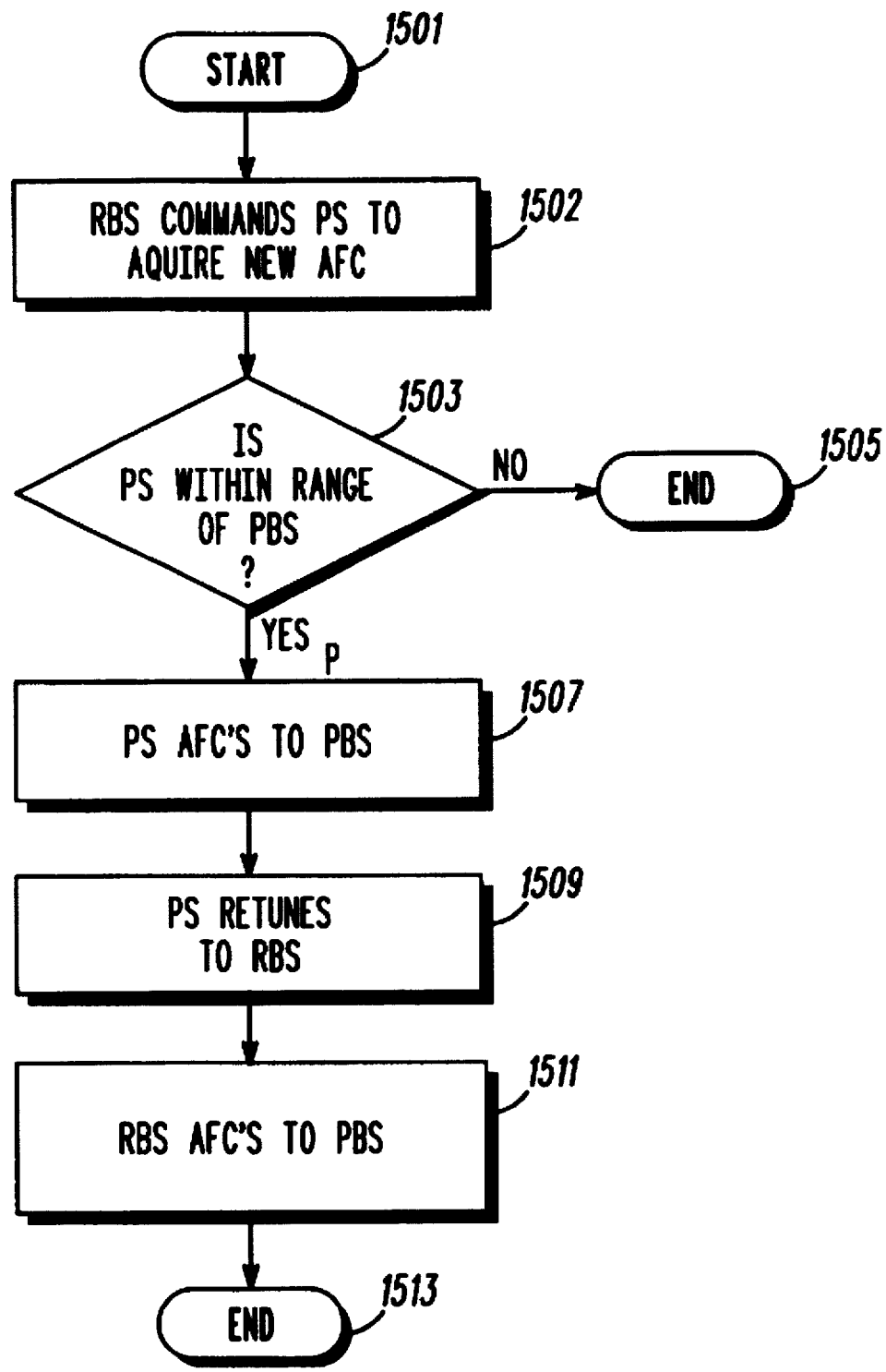
FIG. 16 is a block diagram of a method for updating the reference frequency adjustment in a communication system according to the present invention.

Turning now to FIG. 16, a method for the residential base station to update its reference frequency from the public base station by using the portable station is shown. In particular, the residential base station commands the portable station to acquire a new reference frequency by automatic frequency control. The portable station determines whether it is within range of the public base station at step 1503. If the portable station is not within range, the method is ended at step 1505. However, if the portable station is within range, the portable station adjusts its reference frequency by automatic frequency control to the reference frequency of the portable base station at a step 1507. The portable station then returns to the residential base station at a step 1509. Finally, the residential base station adjusts its frequency to the frequency of the public base station at a step 1511.

Although in the description we have referred to adjusting the reference frequency of a radiotelephone in order to improve the accuracy of the frequency of the transmitted signal, it should be understood that there are other means of adjusting the transmitted frequency accuracy of a radiotelephone and using one or more of those means to adjust the frequency of the transmitted signal does not depart from the spirit of this invention.

We claim:

1. A method for adjusting reference frequencies in a communication system, the communication system comprising a portable station, a residential base station, and a public base station which generates a first reference frequency, the method comprising the steps of:
   (a) adjusting a second reference frequency in the portable station based upon the first reference frequency; and
   (b) adjusting a third reference frequency of the residential base station based upon the second reference frequency.

2. The method for adjusting reference frequencies according to claim 1 further comprising:
   (c) maintaining the third reference frequency based upon the second reference frequency.

3. The method for adjusting reference frequencies according to claim 1 further comprising:
   (c) maintaining the second reference frequency based upon the third reference frequency.

4. A method for adjusting reference frequencies in a communication system, the communication system comprising a portable station adapted to communicate in a first mode with a residential base station and communicate in a second mode a public base station, the method comprising the steps of:
   (a) generating a first reference signal from the public base station;
   (b) detecting the first reference frequency at the portable station;
   (c) adjusting a second reference frequency in the portable station based upon the first reference frequency;
   (d) adjusting a third reference frequency of the residential base station based upon the second reference frequency when in the first mode; and
   (e) registering the portable station with the residential base station when in the first mode.

5. The method for adjusting reference frequencies according to claim 4 further comprising:
   (f) maintaining the third reference frequency based upon the second reference frequency when in the first mode.

6. The method for adjusting reference frequency according to claim 4 further comprising:
   (f) maintaining the second reference frequency based upon the third reference frequency when in the first mode.

7. A method for adjusting the frequency according to claim 4 wherein said step (a) of generating a first reference signal from said base station comprises generating a first reference signal from a cellular base station.

8. A method for adjusting the frequency according to claim 4 wherein said step (a) of generating a first reference signal from said base station comprises generating a first reference signal from a microcellular base station.

9. The method for adjusting reference frequency according to claim 4 further comprising:
   (f) registering the portable station with the public base station when in the second mode.

10. A method for adjusting reference frequencies in a communication system, the communication system comprising a portable station, a residential base station, and a public base station which generates a first reference frequency, the method comprising the steps of:
    adjusting a second reference frequency in the residential base station based upon the first reference frequency; and
    adjusting a third frequency of the portable station based upon the second reference frequency.

11. The method for adjusting reference frequencies according to claim 10 further comprising:
    (c) maintaining the third reference frequency based upon the second reference frequency.

12. A method for adjusting the frequency according to claim 10 further comprising:
    (c) maintaining the second reference frequency based upon the third reference frequency.

13. A method for adjusting reference frequencies in a communication system, the communication system comprising a portable station adapted to communicate in a first mode with a residential base station and communicate in a second mode a public base station, the method comprising the steps of:
    (a) generating a first reference signal from the public base station;
    (b) detecting the first reference frequency at the residential base station;
    (c) adjusting a second reference frequency in the residential base station based upon the first reference frequency;
    (d) adjusting a third reference frequency of the portable base station based upon the second reference frequency when in the first mode; and
    (e) registering the portable station with the residential base station when in the first mode.

14. The method for adjusting reference frequencies according to claim 13 further comprising:
    (f) maintaining the third reference frequency based upon the second reference frequency when in the first mode.

15. The method for adjusting reference frequency according to claim 13 further comprising:

(f) maintaining the second reference frequency based upon the third reference frequency when in the first mode.

16. The method for adjusting reference frequency according to claim 13 further comprising:

(f) registering the portable station with the public base station when in the second mode.

17. A method for adjusting reference frequencies in a communication system, the communication system comprising a portable station, a residential base station, and a public base station which generates a first reference frequency, the method comprising the steps of:

(a) adjusting a second reference frequency in the portable station based upon the first reference frequency; and (b) adjusting a third reference frequency of the residential base station based upon the second reference frequency, said step of adjusting a third reference frequency further comprising the steps of:

(b1) establishing a communication link with said residential base station;

(b2) measuring the residential base frequency error;

(b3) determining whether the residential base frequency error is greater than a threshold;

(b3) reporting the residential base frequency error to the residential base; and (b4) adjusting the reference frequency of the residential base.

18. A method for adjusting reference frequencies of an oscillator in a communication system, the communication system comprising a portable station, a residential base station, and a public base station which generates a first reference frequency, the method comprising the steps of:

(a) adjusting a second reference frequency in the portable station based upon the first reference frequency;

(b) saving a second reference frequency control setting; and (c) adjusting a third reference frequency of the residential base station based upon the second reference frequency, said step of adjusting a third reference frequency further comprising the steps of:

(c1) the portable station measuring the residential base frequency error;

(c2) the portable station adjusting the second reference frequency based on the signal received from the residential base station;

(c3) establishing a communication link with said residential base station;

(c4) determining whether the frequency error is greater than a threshold;

(c5) reporting the error to the residential base;

(c6) adjusting the third reference frequency of the residential base;

(c7) adjusting the second reference frequency in the portable station to said saved second reference frequency control setting;

(c8) the portable station measuring the residential base frequency error; and (c9) the portable station adjusting the second reference frequency based on a signal received from the residential base station.

19. A method for adjusting reference frequencies in a communication system, the communication system comprising a portable station, a residential base station, and a public base station which generates a first reference frequency, the method comprising the steps of:

(a) adjusting a second reference frequency in the portable station based upon the first reference frequency;

(b) saving a second reference frequency control setting; and (c) adjusting a third reference frequency of the residential base station based upon the second reference frequency, said steps of adjusting a third reference frequency comprising the steps of:

(c1) the portable station adjusting the second reference frequency based on the signal received from the residential base station;

(c2) establishing a communication link with said residential base station;

(c3) determining the residential base station frequency error as a function of the second reference frequency control setting and the saved second reference control setting;

(c4) determining whether the residential base station frequency error is greater than a threshold;

(c5) reporting the residential base station frequency error to the residential base;

(c6) adjusting the third reference frequency of the residential base; and (c7) the portable station adjusting the second reference frequency based on a signal received from the residential base station.

* * * * *